United States Patent
Feng et al.

(10) Patent No.: US 11,711,024 B2
(45) Date of Patent: Jul. 25, 2023

(54) POWER MODULE ASSEMBLY AND CONVERTER

(71) Applicant: Delta Electronics (Shanghai) CO., LTD, Shanghai (CN)

(72) Inventors: Bo Feng, Shanghai (CN); Jun Chen, Shanghai (CN); Wei Huang, Shanghai (CN); Shisheng Hou, Shanghai (CN); Yansong Lu, Shanghai (CN); Jingxian Kuang, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 312 days.

(21) Appl. No.: 17/120,433

(22) Filed: Dec. 14, 2020

(65) Prior Publication Data

US 2021/0194381 A1 Jun. 24, 2021

(30) Foreign Application Priority Data

Dec. 19, 2019 (CN) .......................... 201911319707.8

(51) Int. Cl.
*H02M 7/00* (2006.01)
*H05K 7/14* (2006.01)
(Continued)

(52) U.S. Cl.
CPC ............ *H02M 7/003* (2013.01); *H02G 5/005* (2013.01); *H02M 3/1584* (2013.01); *H05K 7/1427* (2013.01); *H05K 7/209* (2013.01)

(58) Field of Classification Search
CPC .... H02M 3/1584; H02M 7/003; H02G 5/005; H05K 7/1427; H05K 7/1432; H05K 7/209; H05K 2201/10272
See application file for complete search history.

(56) References Cited

U.S. PATENT DOCUMENTS 3,857,044 A * 12/1974 Papoi ................... H05K 7/1432
307/9.1
2006/0007720 A1* 1/2006 Pfeifer ............... H05K 7/20927
361/698
(Continued)

FOREIGN PATENT DOCUMENTS

CN 201230431 Y 4/2009
CN 103368359 A 10/2013
(Continued)

OTHER PUBLICATIONS

Wang CN201230431Y translation.*
The 1st Office Action dated Dec. 21, 2021 for CN patent application No. 2019113197078.

*Primary Examiner* — Jacob R Crum
(74) *Attorney, Agent, or Firm* — Qinghong Xu

(57) ABSTRACT

The present disclosure provides a power module assembly and a converter. The power module assembly includes a power module and a capacitor module, and the power module and the capacitor module are configured to be detachably connected; the power module includes a first bus bar, and the first bus bar includes a first connection portion and a power installation portion connected to the first connection portion; the capacitor module includes a second bus bar, and the second bus bar includes a second connection portion and a capacitor installation portion connected to the second connection portion, wherein the first connection portion and the second connection portion extend along a first direction, and the power installation portion and the capacitor installation portion extend along a second direction; the first connection portion and the second connection portion are connected by a fastener.

17 Claims, 4 Drawing Sheets

(51) Int. Cl.
    *H02G 5/00*     (2006.01)
    *H02M 3/158*     (2006.01)
    *H05K 7/20*     (2006.01)

(56) References Cited

U.S. PATENT DOCUMENTS

| | | | |
|---|---|---|---|
| 2011/0308834 A1* | 12/2011 | Takahashi | H02M 7/003 |
| | | | 174/68.2 |
| 2012/0236489 A1 | 9/2012 | Foo | |
| 2013/0271941 A1 | 10/2013 | Guan | |
| 2014/0062210 A1* | 3/2014 | Wagoner | H05K 7/209 |
| | | | 307/89 |
| 2014/0111959 A1* | 4/2014 | Li | H02M 7/003 |
| | | | 174/68.2 |
| 2015/0340157 A1* | 11/2015 | Wen | H01G 4/228 |
| | | | 361/328 |
| 2017/0188484 A1* | 6/2017 | Kwon | H05K 7/20727 |

FOREIGN PATENT DOCUMENTS

| | | |
|---|---|---|
| CN | 204168127 U | 2/2015 |
| CN | 206283407 U | 6/2017 |
| CN | 208797835 U | 4/2019 |
| CN | 110474518 A | 11/2019 |

* cited by examiner

POWER MODULE ASSEMBLY AND CONVERTER

CROSS-REFERENCE TO RELATED APPLICATION

The present application claims benefit of Chinese Patent Application No. 201911319707.8, filed on Dec. 19, 2019, the disclosures of which are hereby incorporated by reference in its entirety.

TECHNICAL FIELD

The present disclosure relates to the field of power equipment, and in particular, to a power module assembly and a converter.

BACKGROUND

For currently used converters, capacitor module and power module in a power module assembly are usually designed as inseparable structures. A plurality of capacitors and Insulated Gate Bipolar Transistor (IGBT) and other components are required in the power module assembly, and the power module assembly may have a large weight up to over 100 kg.

The above information disclosed in the Background section is only used to enhance the understanding of the background of the present disclosure, so it may include information that does not constitute the prior art known to those of ordinary skill in the art.

SUMMARY

The present disclosure provides a power module assembly and a converter.

Other features and advantages of the disclosure will become apparent from the following detailed description, or may be learned in part through the practice of the disclosure.

According to an aspect of the present disclosure, a power module assembly is provided, including: a power module and a capacitor module; the power module and the capacitor module are configured to be detachably connected; the power module includes a first bus bar, and the first bus bar includes a first connection portion and a first installation portion connected to the first connection portion, wherein the first connection portion extends along a first direction, and the first installation portion extends along a second direction different from the first direction; the capacitor module includes a second bus bar, and the second bus bar includes a second connection portion and a second installation portion connected to the second connection portion, wherein the second connection portion extends along the first direction, and the second installation portion extends along the second direction; the first connection portion and the second connection portion are connected by a fastener.

According to another aspect of the present disclosure, a converter is provided, including: the power module assembly described above.

It should be understood that the above general description and the following detailed description are merely exemplary, and should not limit the present disclosure.

BRIEF DESCRIPTION OF THE DRAWINGS

The above and other objects, features, and advantages of the present disclosure will become more apparent by describing its example embodiments in detail with reference to the accompanying drawings.

DETAILED DESCRIPTION

Figure 1:
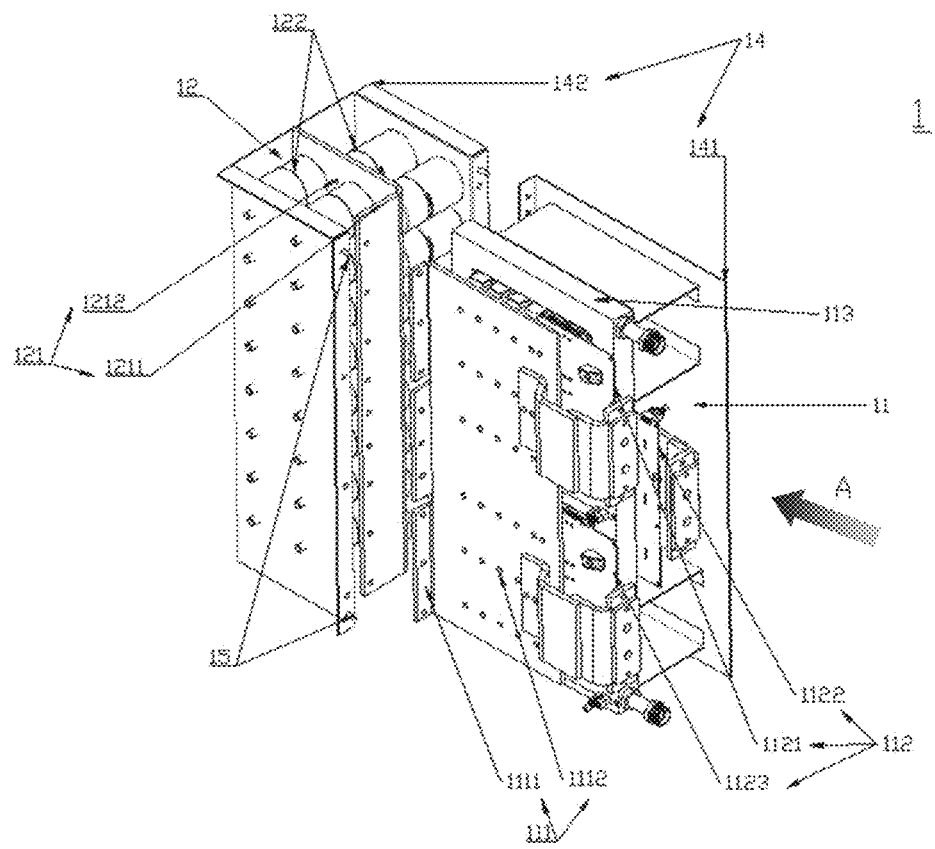
FIG. 1 is a schematic structural diagram of a power module assembly according to an exemplary embodiment.

Example embodiments will now be described more fully with reference to the accompanying drawings. However, the exemplary embodiments can be implemented in various forms and should not be construed as limited to the examples set forth herein; rather, providing these embodiments makes the present disclosure more comprehensive and complete, and conveys the concepts of the exemplary embodiments comprehensively to those skilled in the art. The drawings are merely schematic illustrations of the present disclosure and are not necessarily drawn to scale. The same reference numerals in the drawings represent the same or similar parts, and thus repeated descriptions thereof will be omitted.

Furthermore, the described features, structures, or characteristics may be combined in any suitable manner in one or more embodiments. In the following description, numerous specific details are provided to give a thorough understanding of the embodiments of the present disclosure. However, those skilled in the art will realize that the technical solutions of the present disclosure may be practiced without omitting one or more of the specific details, or other methods, components, devices, steps, etc. may be adopted. In other instances, well-known structures, methods, devices, implementations, or operations have not been shown or described in detail to avoid obsession and obscure aspects of the present disclosure.

In the present disclosure, the terms "connected" "connection", and the like should be understood in a broad sense unless specified otherwise, for example, they may be electrically connected or coupled; they may be directly connected or indirectly through an intermediate medium connected. For those of ordinary skill in the art, the specific meanings of the above terms in the present disclosure can be understood according to specific situations.

In addition, in the description of the present disclosure, the terms "first" and "second" are used for descriptive purposes only, and cannot be understood as indicating or implying relative importance or implicitly indicating the number of indicated technical features. Therefore, the features defined as "first" and "second" may explicitly or implicitly include one or more of the features.

As mentioned above, for the converter currently used, the capacitor module and the power module in a power module assembly are usually designed as inseparable, which is very inconvenient for maintenance operations. Therefore, the present disclosure proposes a new power module assembly structure, which will be specifically described below through various embodiments of the present disclosure.

FIG. 1 is a schematic structural diagram of a power module assembly according to an exemplary embodiment. For example, the power module assembly shown in FIG. 1 can be applied to various types of converters such as an inverter.

Referring to FIG. 1, a power module assembly 1 includes a power module 11 and a capacitor module 12, and the power module 11 and the capacitor module 12 are configured to be detachably connected.

The power module 11 includes a first bus bar 111. The first bus bar 111 includes a first connection portion 1111 and a first installation portion 1112 connected to the first connection portion 1111. The first connection portion 1111 extends along a first direction and the first installation portion 1112 extends along a second direction, and the second direction is different from the first direction.

Optionally, the first connection portion 1111 and the first installation portion 1112 are vertically connected. It should be noted that, in the present disclosure, an included angle between the first connection portion 1111 and the first installation portion 1112 within a range of about 90° (for example, 90°±10°) can be equivalent to "vertical", and the definitions of "vertical" appearing in the present disclosure are applicable to this interpretation.

The capacitor module 12 includes a second bus bar 121. The second bus bar 121 includes a second connection portion 1211 and a second installation portion 1212 connected to the second connection portion 1211, wherein the second connection portion 1211 extends along the first direction and the second installation portion 1212 extends along the second direction.

As above, the second connection portion 1211 and the second installation portion 1212 are optionally connected vertically.

Figure 2:
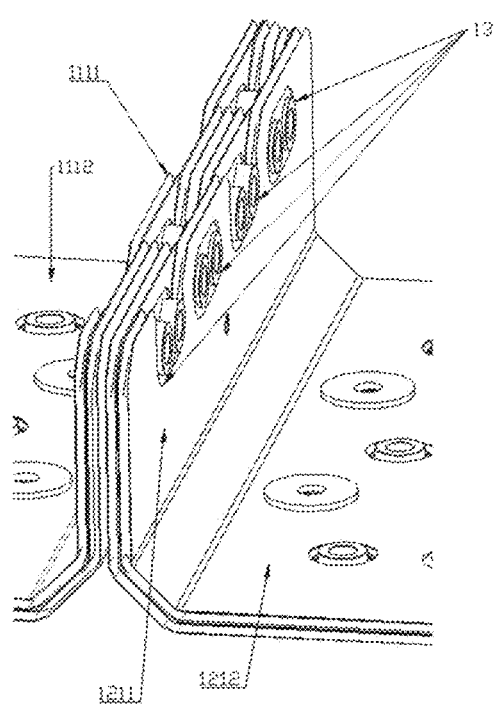
FIG. 2 is a stereo schematic view of fastened connection between the first connection portion and the second connection portion according to an exemplary embodiment.

In addition, the first connection portion 1111 and the second connection portion 1211 are connected by a fastener 13. For details, refer to FIG. 2.

The fastener 13 may be, for example, a bolt, or a plug cooperates with a socket opened at a corresponding position of the first connection portion 1111 and the second connection portion 1211. The present disclosure does not limit the specific form of the fastener 13.

According to the power module assembly provided by the embodiment of the present disclosure, the capacitor module and the power module are in separable design, which facilitates separate disassembly and maintenance of the power module prone to failure. Meantime, the bus bar of the capacitor module and the bus bar of the power module are directly and tightly fastened and connected, which effectively reduces the stray inductance between the bus bars.

It should be clearly understood that the present disclosure describes how to make and use specific examples, but the principles of the present disclosure are not limited to any details of these examples. Rather, these principles can be applied to many other embodiments based on the teachings of this disclosure.

In some embodiments, both the first bus bar 111 and the second bus bar 121 may be laminated bus bars. In the following description, both the first bus bar 111 and the second bus bar 121 are described by taking a double-layer laminated bus bar as an example.

Figure 3:
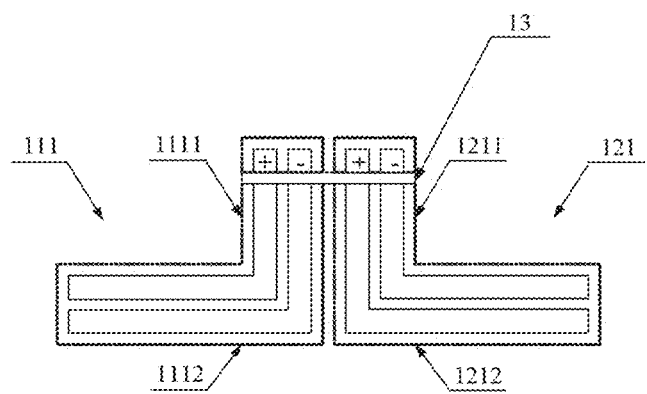
FIG. 3 is a schematic plan view of a connection of two laminated bus bars according to an exemplary embodiment.

As described above, the first connection portion 1111 and the second connection portion 1211 are firmly connected. Optionally, as shown in FIG. 3, the first connection portion 1111 includes a first positive conductive layer and a first negative conductive layer, and the second connection portion 1211 includes a second positive conductive layer and a second negative conductive layer. When the first connection portion 11 and the second connection portion 1211 are connected, the first positive conductive layer, the first negative conductive layer, the second positive conductive layer, and the second negative conductive layer should be arranged in this order, or the first negative conductive layer, the first positive conductive layer, the second negative conductive layer, and the second positive conductive layer is sequentially arranged, as long as the adjacent conductive layers have opposite polarities.

That is, the laminated bus bars of the connection portion are arranged in the order of "positive-negative-positive-negative" or "negative-positive-negative-positive" so that currents of equal magnitude and opposite directions flow between adjacent conductive layers of the first bus bar 111 and the second bus bar 121. Based on the principle of mutual inductance cancellation, mutual inductance between adjacent conductive layers is cancelled, mutual inductance between spaced conductive layers is strengthened, and the amount of inductance is negatively related to the distance between conductive layers. Therefore, the amount of inductance canceled by the adjacent conductive layers on the inner side is greater than the increased inductance of the spaced conductive layers, resulting in a reduction in the total inductance of the current path. Therefore, the staggered design of the bus bar polarities at the connection provided by the embodiments of the present disclosure can further reduce the stray inductance between the bus bars of the power module assembly.

Continuing to refer to FIG. 1, the capacitor module 12 further includes a plurality of DC capacitors 122. Part of the DC capacitors 122 are installed on the front surface of the second installation portion 1212, and the other part are installed on the reverse surface of the second installation portion 1212. Optionally, the DC capacitors 122 are evenly distributed on the front and rear sides of the second installation portion 1212 in an array. It should be noted that, in some embodiments, the DC capacitors 122 on the front and rear sides of the second installation portion 1212 may be equal or substantially equal in number, and in structure, in order to allow all the DC capacitors 122 to be connected to the second installation portion 1212, the DC capacitors 122 on the front and rear sides may be staggered.

According to the power module assembly provided by some embodiments of the present disclosure, the DC capacitors are divided into two groups, which are respectively arranged on the front and rear sides of a capacitor bus bar, which greatly reduce the area of the capacitor bus bar, thereby lowering the center of gravity of the capacitor bus bar and reducing the overall height, and making the structure of the power module assembly more compact, while reducing the stray inductance between the capacitor module and the power module, thereby reducing the off-voltage stress of the IGBT in the power module.

Refer to FIG. 1, the power module 11 further includes a three-phase IGBT module 112 connected to the first installation portion 1112. The three-phase IGBT module 112 includes: a first phase sub-module 1121, a second phase sub-module 1122, and a third phase sub-module 1123. Optionally, the second phase sub-module 1122 is a middle phase sub-module of the three-phase IGBT module 112.

Figure 4:
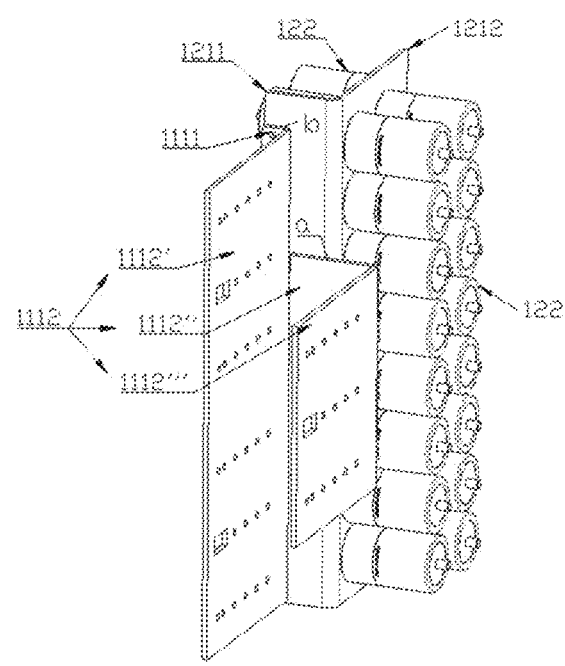
FIG. 4 is a simplified schematic diagram of an internal structure of the power module assembly shown in FIG. 1.

Optionally, as shown in FIG. 4, in the first installation portion 1112, the length of the portion "a" connected to the second phase sub-module 1122 (not shown in FIG. 4) is greater than the length of the portion "b" connected to the first phase sub-module 1121 (not shown in FIG. 4) and the third phase sub-module 1123 (not shown in FIG. 4).

According to the power module assembly provided by some embodiments of the present disclosure, the installation part connected to the middle-phase sub-module is appropriately lengthened so that the equivalent current paths of the three-phase sub-modules to the DC capacitors are the same or basic the same, thereby ensuring that the stray inductances of the current path between the three-phase sub-modules and the DC capacitors are relatively consistent, effectively balancing the electrical stress between the three-phase sub-modules and the ripple current of the DC capacitors.

As shown in FIG. 4, in order to make the length of "a" greater than the length of "b", the first installation portion 1112 may include a first extension portion 1112' connected to the first connection portion 1111, and a third connection portion 1112", and a second extension portion 1112''' connected to the third connection portion 1112"; wherein, the first extension portion 1112' and the second extension portion 1112''' both extend along a second direction, and the third connection portion 1112" extends along a first direction. In addition, the third connection portion 1112" which is coplanar with the first connection portion 1111, is connected to the second connection portion 1211 by the fastener 13, the second phase sub-module 1122 is connected to the second extension portion 1112''', and the first phase sub-module 1121 and the third phase sub-module 1123 are connected to the first extension portion 1112'.

As shown in FIG. 1, the power module 11 further includes a heat dissipation device 113 disposed in parallel with the first installation portion 1112. It should be noted that, in the present disclosure, the included angle between the heat dissipation device 113 and the first installation portion 1112 in the range of about 0° (for example, 0°±15°) can be equivalent to "parallel", and the definitions of "parallel" in the present disclosure are applicable to this interpretation.

The heat dissipation device 113 is configured to dissipate heat from the three-phase IGBT module 112. Further, the three-phase IGBT module 112 may be disposed between the heat dissipation device 113 and the first installation portion 1112 to directly transfer heat generated by the three-phase IGBT module 112 through the heat dissipation device 113.

Wherein, an optional embodiment of the heat dissipation device 113 is a water-cooled plate. While the heat dissipation device 113 may also be another type of cooling device, which is not limited in the present disclosure.

In the embodiment shown in FIG. 1, the first phase sub-module 1121 and the third phase sub-module 1123 are both disposed on one side of the heat dissipation device 113, and the second phase sub-module 1122 is disposed on the other side of the heat dissipation device 113.

According to the power module assembly provided by some embodiments of the present disclosure, the three-phase IGBT modules are distributed on both sides of the heat dissipation device, which significantly reduces the height of the power module assembly, reduces the maintenance difficulty, and improves the power density of the power module assembly.

As shown in FIG. 1, the power module assembly 1 further includes: a sheet metal structure 14 and a positioning component 15. The sheet metal structure 14 includes a first sheet metal structure 141 (not completely shown in the figure) and a second sheet metal structure 142. The first sheet metal structure 141 surrounds the power module 11, and the second sheet metal structure 142 surrounds the capacitor module 12. The positioning component 15 may be, for example, a positioning pin for positioning the first sheet metal structure 141 and the second sheet metal structure 142 to ensure that the power module 11 and the capacitor module 12 are aligned and reliably connected, which is helpful for the fastener 13 to fasten the first connection portion 1111 and the second connection portion 1211.

Alternatively, as shown in FIG. 1, the positioning component 15 may be disposed at two ends where the first sheet metal structure 141 and the second sheet metal structure 142 joint.

Following the above, the power module assembly 1 shown in FIG. 1 can be applied to various types of converters such as an inverter or a wind power converter. The converter includes a power module assembly 1 and a cabinet (not shown) in which the power module assembly 1 is loaded. The cabinet door is disposed on the operable side of the fastener 13 to facilitate maintenance personnel from the cabinet. Relevant operations are performed on the fastener 13 on the front side, thereby facilitating separate disassembly and maintenance of the power module 11 which is prone to failure.

According to the converter provided by the embodiment of the present disclosure, by referring to FIG. 1: when removing the power module assembly 1, the maintenance personnel opens the cabinet door (located on the front of the cabinet, perpendicular to the direction indicated by arrow A), and removes the fastener 13 (located on the first connection portion 1111) to separate the power module 11 from the capacitor module 12, then the power module 11 and the capacitor module 12 can be taken out of the cabinet in the opposite direction indicated by the arrow A; otherwise, when installing the power module assembly 1, the maintenance personnel can place the capacitor module 12 and the power module 11 in the cabinet in the direction indicated by the arrow A, and install the fastener 13 so that the power module 11 and the capacitor module 12 are fixedly connected. Therefore, disassembly and assembly can be completed through the cabinet door on the front of the cabinet, and no other orientation of the cabinet is needed, which effectively reduces the maintenance difficulty of the converter.

According to the power module assembly provided by the present disclosure, the capacitor module and the power module have a separable design, which facilitates separate disassembly and maintenance of the power module that is prone to failure. Meanwhile, a bus bar of the capacitor module and a bus bar of the power module are directly and tightly fastened and connected, which effectively reduces stray inductance between the bus bars.

The exemplary embodiments of the present disclosure have been specifically shown and described above. It should be understood that the disclosure is not limited to the detailed structure, arrangement or implementation methods described herein; rather, the disclosure is intended to cover various modifications and equivalent arrangements included within the spirit and scope of the appended claims.

What is claimed is:

1. A power module assembly, comprising: a power module and a capacitor module, the power module and the capacitor module being configured to be detachably connected;

the power module comprises: a first bus bar, comprising a first connection portion and a first installation portion connected to the first connection portion, wherein, the first connection portion is extended along a first direction, and the first installation portion is extended along a second direction different from the first direction;

the capacitor module comprises: a second bus bar, comprising a second connection portion and a second installation portion connected to the second connection portion, wherein the second connection portion is extended along the first direction, and the second installation portion is extended along the second direction;

the first connection portion and the second connection portion are connected by a fastener, wherein, the power module further comprises a three-phase insulated gate bipolar transistor module, and the three-phase insulated gate bipolar transistor module comprises a first phase sub-module, a second phase sub-module and a third phase sub-module; the three-phase insulated gate bipolar transistor module is connected to the first installation portion, and wherein, in the first installation portion, a length of a portion connected to the second phase sub-module is longer than a length of a portion connected to the first phase sub-module and a length of a portion connected to the third phase sub-module.

2. The power module assembly according to claim 1, wherein, the first bus bar and the second bus bar are both laminated bus bars.

3. The power module assembly according to claim 2, wherein, the first connection portion comprises a first positive conductive layer and a first negative conductive layer, and the second connection portion comprises a second positive conductive layer and a second negative conductive layer; wherein, the first positive conductive layer, the first negative conductive layer, the second positive conductive layer and the second negative conductive layer are arranged successively, or the first negative conductive layer, the first positive conductive layer, the second negative conductive layer and the second positive conductive layer are arranged successively.

4. The power module assembly according to claim 2, wherein, the capacitor module further comprises a plurality of DC capacitors, wherein part of the plurality of DC capacitors are installed on a front surface of the second installation portion, and other part of the plurality of DC capacitors are installed on a rear side of the second installation portion.

5. The power module assembly according to claim 4, wherein, the plurality of DC capacitors are evenly distributed in an array form on the front side and the rear side of the second installation portion.

6. The power module assembly according to claim 1, wherein, the first installation portion comprises: a first extension portion connected to the first connection portion, a third connection portion, and a second extension portion connected to the third connection portion; wherein, the first extension portion and the second extension portion are both extended along the second direction, and the third connection portion is extended along the first direction; the third connection portion is connected to the second connection portion by a fastener, and the second phase sub-module is connected to the second extension portion.

7. The power module assembly according to claim 1, wherein, the power module further comprises a heat dissipation device; the heat dissipation device is disposed in parallel with the first installation portion, and is configured to dissipate heat from the three-phase insulated gate bipolar transistor module.

8. The power module assembly according to claim 7, wherein, the first phase sub-module, the second phase sub-module, and the third phase sub-module are all located between the heat dissipation device and the first installation portion.

9. The power module assembly according to claim 6, wherein, the power module further comprises a heat dissipation device; the first phase sub-module and the third phase sub-module are both disposed on one side of the heat dissipation device, and the second phase sub-module is disposed on the other side of the heat dissipation device.

10. The power module assembly according to claim 1, wherein, the second phase sub-module is a middle phase sub-module of the three-phase insulated gate bipolar transistor module.

11. The power module assembly according to claim 1, further comprising: a sheet metal structure and a positioning component; the sheet metal structure comprises a first sheet metal structure and a second sheet metal structure, wherein the power module is surrounded by the first sheet metal structure, and the capacitor module is surrounded by the second sheet metal structure; and the positioning component is configured to position the first sheet metal structure and the second sheet metal structure.

12. A converter, comprising a power module assembly, wherein the power module assembly comprises:

a power module and a capacitor module, the power module and the capacitor module being configured to be detachably connected;

the power module comprises: a first bus bar, comprising a first connection portion and a first installation portion connected to the first connection portion, wherein, the first connection portion is extended along a first direction, and the first installation portion is extended along a second direction different from the first direction;

the capacitor module comprises: a second bus bar, comprising a second connection portion and a second installation portion connected to the second connection portion, wherein the second connection portion is extended along the first direction, and the second installation portion is extended along the second direction;

the first connection portion and the second connection portion are connected by a fastener, wherein, the power module further comprises a three-phase insulated gate bipolar transistor module, and the three-phase insulated gate bipolar transistor module comprises a first phase sub-module, a second phase sub-module and a third phase sub-module; the three-phase insulated gate bipolar transistor module is connected to the first installation portion, and wherein, in the first installation portion, a length of a portion connected to the second phase sub-module is longer than a length of a portion connected to the first phase sub-module and a length of a portion connected to the third phase sub-module.

13. The converter according to claim 12, further comprising: a cabinet; the cabinet comprises a cabinet door, and the cabinet door is disposed on an operable side of the fastener.

14. The converter according to claim 12, wherein, the first bus bar and the second bus bar are both laminated bus bars.

15. The converter according to claim 14, wherein, the first connection portion comprises a first positive conductive layer and a first negative conductive layer, and the second connection portion comprises a second positive conductive layer and a second negative conductive layer; wherein, the first positive conductive layer, the first negative conductive layer, the second positive conductive layer and the second negative conductive layer are arranged successively, or the first negative conductive layer, the first positive conductive layer, the second negative conductive layer and the second positive conductive layer are arranged successively.

16. The converter according to claim 14, wherein, the capacitor module further comprises a plurality of DC capacitors, wherein part of the plurality of DC capacitors are installed on a front surface of the second installation portion, and other part of the plurality of DC capacitors are installed on a rear side of the second installation portion.

17. The converter according to claim 16, wherein, the plurality of DC capacitors are evenly distributed in an array form on the front side and the rear side of the second installation portion.

* * * * *